US011255878B2

(12) United States Patent
Kishi et al.

(10) Patent No.: US 11,255,878 B2
(45) Date of Patent: Feb. 22, 2022

(54) ELECTRICAL CONTACTOR AND ELECTRICAL CONNECTING APPARATUS

(71) Applicant: KABUSHIKI KAISHA NIHON MICRONICS, Tokyo (JP)

(72) Inventors: Yasutaka Kishi, Tokyo (JP); Masahiro Wakazawa, Tokyo (JP)

(73) Assignee: KABUSHIKI KAISHA NIHON MICRONICS, Tokyo (JP)

(*) Notice: Subject to any disclaimer, the term of this patent is extended or adjusted under 35 U.S.C. 154(b) by 0 days.

(21) Appl. No.: 16/940,827

(22) Filed: Jul. 28, 2020

(65) Prior Publication Data

US 2021/0041482 A1 Feb. 11, 2021

(30) Foreign Application Priority Data

Aug. 9, 2019 (JP) ............................ JP2019-147760

(51) Int. Cl.
*G01R 1/067* (2006.01)
*G01R 1/073* (2006.01)
(Continued)

(52) U.S. Cl.
CPC ..... *G01R 1/07342* (2013.01); *G01R 1/06727* (2013.01); *G01R 31/2887* (2013.01)

(58) Field of Classification Search
CPC ........ G01R 1/067; G01R 1/073; G01R 31/00; G01R 31/02; G01R 31/28
See application file for complete search history.

(56) References Cited

U.S. PATENT DOCUMENTS 5,286,208 A * 2/1994 Matsuoka ............ H01R 13/112 439/72
7,553,165 B2 * 6/2009 Mathieu ................... G01R 3/00 439/66
(Continued)

FOREIGN PATENT DOCUMENTS

JP 2009-229410 A 10/2009
JP 5886694 B2 3/2016
(Continued)

OTHER PUBLICATIONS

Search Report in First Office Action dated Apr. 20, 2021 in corresponding Taiwan Patent Appln. No. 109124892.
(Continued)

*Primary Examiner* — Neel D Shah
(74) *Attorney, Agent, or Firm* — Bacon & Thomas, PLLC

(57) ABSTRACT

An object of the present disclosure is to make it possible to improve electrical inspection of an object to be inspected by making the conduction characteristics of the electrical signal flowing through an electrical contactor better. An electrical contactor according to the present disclosure includes: a pedestal portion having, at a lower end thereof, a contact portion that comes into contact with a first contact target of an object to be inspected; a base end portion extending continuously toward an installing portion that comes into contact with a second contact target of a substrate electrically connected to an inspection device side; and at least three or more arm portions provided between the base end portion and the pedestal portion, each of the at least three or more arm portions having one end supported by the base end portion and another end coupled to the pedestal portion to elastically support the contact portion.

6 Claims, 6 Drawing Sheets

(51) Int. Cl.
*G01R 31/00* (2006.01)
*G01R 31/28* (2006.01)

(56) References Cited

U.S. PATENT DOCUMENTS

| | | | | |
|---|---|---|---|---|
| 7,629,807 | B2 | 12/2009 | Hirakawa et al. | |
| 8,729,916 | B2 * | 5/2014 | Chen | C25D 5/02 324/755.05 |
| 2007/0216433 | A1 | 9/2007 | Miura et al. | |
| 2008/0197869 | A1 * | 8/2008 | Miyagi | G01R 1/44 324/750.03 |
| 2009/0045831 | A1 | 2/2009 | Kimoto | |
| 2012/0061009 | A1 | 3/2012 | Chen et al. | |

FOREIGN PATENT DOCUMENTS

| | | | |
|---|---|---|---|
| KR | 10-1963805 | B1 | 4/2019 |
| TW | 201415035 | A | 4/2014 |

OTHER PUBLICATIONS

Search Report in Non-Final Office Action dated Sep. 9, 2021 in corresponding Singapore Patent Appln. No. 10202006954T.

First Office Action dated Oct. 29, 2021 in corresponding Korean Patent Appln . No. 10-2020-0095087.

* cited by examiner

ELECTRICAL CONTACTOR AND ELECTRICAL CONNECTING APPARATUS

CROSS-REFERENCE TO RELATED APPLICATIONS

The present application claims, under 35 USC 119, priority of Japanese Patent Application No. 2019-147760 filed on Aug. 9, 2019.

TECHNICAL FIELD

The present disclosure relates to an electrical contactor and an electrical connecting apparatus, and is applicable to, for example, an electrical contactor and an electrical connecting apparatus used for electrical inspection of a semiconductor integrated circuit and the like formed on a semiconductor wafer.

BACKGROUND ART

The electrical inspection of each semiconductor integrated circuit (object to be inspected) formed on a semiconductor wafer uses an inspection device (a tester) in which an electrical connecting apparatus such as a probe card having a plurality of probes (hereinafter also referred to as "electrical contactors"), is installed onto a test header.

The probe card is equipped with a plurality of probes such that the tips of the respective probes protrude from a lower surface of the probe card. When an object to be inspected is pressed against the probe card, the tip of each probe and an electrode terminal corresponding to the object to be inspected come into electrical contact with each other. During the inspection, an electrical signal from the inspection device is supplied to each object to be inspected via each probe, and then a signal from each object to be inspected is taken in by the inspection device side via each probe, thereby conducting the electrical inspection of each object to be inspected.

In recent years, along with higher density, higher integration, and the like of a semiconductor integrated circuit, the diameter of the electrode terminal of the semiconductor integrated circuit has become smaller, and the pitch of the intervals between electrode terminals has become narrower. In this regard, a cantilever probe is used to ensure electrical contact with the electrode terminals with a smaller diameter and narrower pitch.

For example, Patent Literature 1 discloses a cantilever probe that includes an installing portion, two arm portions extending in the left and right directions from the installing portion, and a pedestal portion coupling the two arm portions on the tip sides of the two arm portions, wherein the probe has, at a lower end of the pedestal portion, a contact portion that comes into electrical contact with an electrode terminal. The rear ends of the two arm portions are supported by the installing portion, and the two arm portions each function as a portion that elastically supports the contact portion when the contact portion of the probe and the electrode terminal of the object to be inspected come into electrical contact with each other.

Each arm portion elastically supports the contact portion of the probe when the contact portion of the probe and the electrode terminal of the object to be inspected are electrically connected with each other, thereby causing the position of the contact portion of the probe to move in an arc around the installing portion as the center. Therefore, the amount of movement of the contact portion needs to be adjusted.

Further, to lessen damage or the like of the surface of the electrode terminal, it is also necessary to appropriately adjust the needle pressure (the pressure at the time of contact) of the contact portion against the electrode terminal.

Therefore, conventionally, the amount of movement of the contact portion of the probe or the needle pressure of the contact portion against the electrode terminal, as mentioned above, is adjusted to a target value by finely adjusting the thickness of each of the two arms of the probe (hereinafter also referred to as an "arm width") and the like.

CITATION LIST

Patent Literature 1: Japanese Laid-Open Patent Application Publication No. 2009-229410

SUMMARY OF INVENTION

Technical Problem

In order to improve electrical inspection of the object to be inspected and inspect the object to be inspected with high accuracy, it is necessary to make the conduction characteristics of the electrical signal flowing through the probe better. For this reason, it is required to reduce the resistance value of the two arm portions.

However, conventionally it is difficult to design the arm portion of the probe from the viewpoint of reducing the resistance value of the entire arm portions. This is because the arm widths of the two arm portions are finely adjusted in order to adjust the target needle pressure, the amount of movement of the contact portion with respect to the electrode terminal, and the like as mentioned above, but if the arm width is increased, the elasticity of the arm portion becomes lower, which may affect the target needle pressure, the amount of movement of the contact portion, and the like.

In addition, there is also another problem in which each arm portion may be plastically deformed by joule heat when an electrical signal flows through the probe during electrical inspection of the object to be inspected because each conventional arm portion has a high resistance value.

Thus, there is a need for an electrical contactor and an electrical connecting apparatus that can improve the electrical inspection of an object to be inspected by making the conduction characteristics of the electrical signal flowing through an electrical contactor better.

Solution to Problem

To solve such problems, an electrical contactor according to a first aspect of the present disclosure is characterized by including: a pedestal portion having, at a lower end thereof, a contact portion that comes into contact with a first contact target of an object to be inspected; a base end portion extending continuously toward an installing portion that comes into contact with a second contact target of a substrate electrically connected to an inspection device side; and at least three or more arm portions provided between the base end portion and the pedestal portion, each of the at least three or more arm portions having one end supported by the base end portion and another end coupled to the pedestal portion to elastically support the contact portion.

An electrical connecting apparatus according to a second aspect of the present disclosure is characterized by including a plurality of electrical contactors that come into electrical contact with a first contact target and a second contact target, the electrical connecting apparatus electrically connecting the first contact target and the second contact target via each of the electrical contactors, wherein each of the plurality of electrical contactors is the electrical contactor according to the first aspect of the present disclosure.

Advantageous Effects of Invention

According to the present disclosure, the electrical inspection of an object to be inspected can be improved by making the conduction characteristics of the electrical signal flowing through an electrical contactor better.

DESCRIPTION OF EMBODIMENTS (A) Main Embodiment

In the following, a main embodiment of an electrical contactor and an electrical connecting apparatus according to the present disclosure will be described in detail with reference to the drawings.

(A-1) Configuration of Embodiment (A-1-1) Electrical Connecting Apparatus

Figure 2:
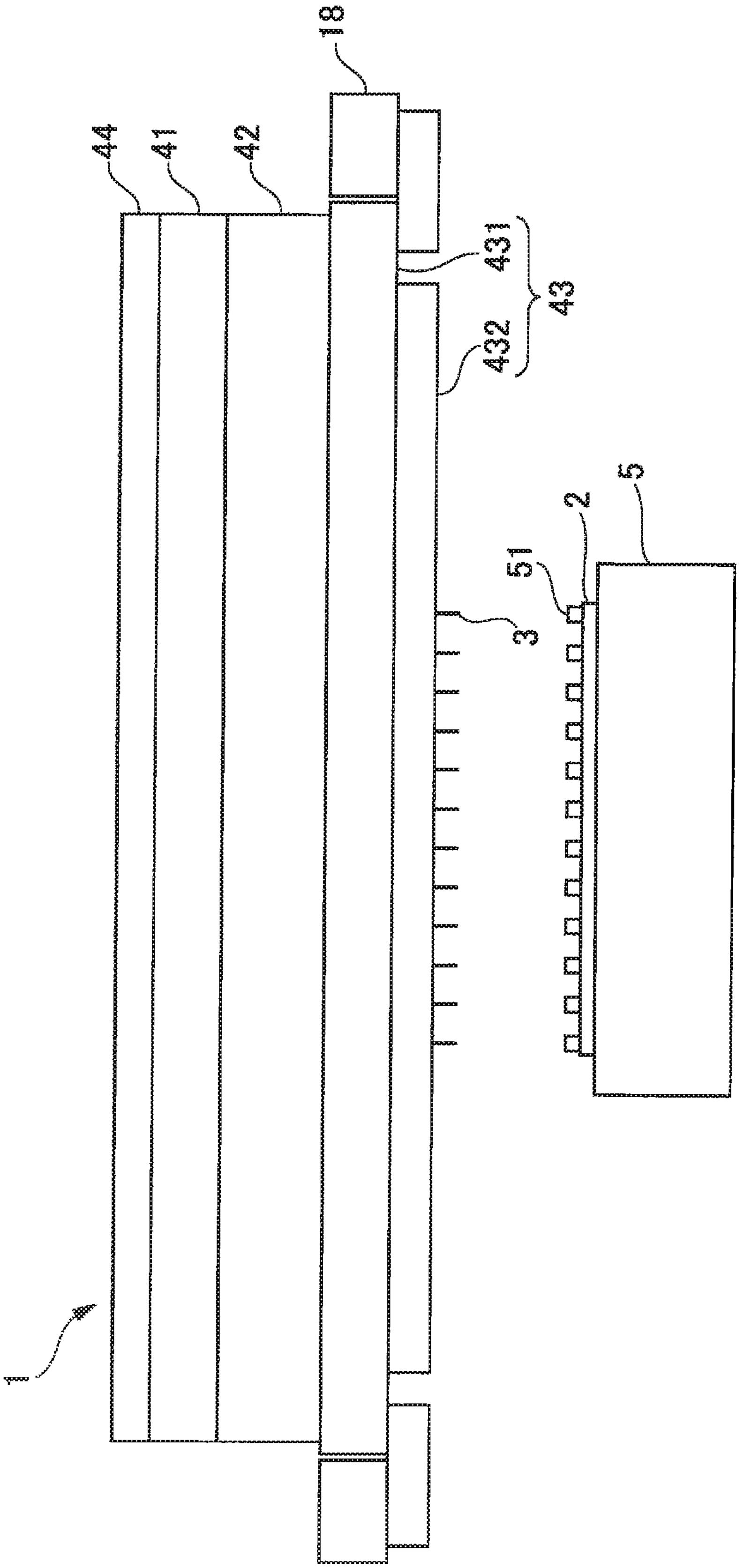
FIG. 2 is a configuration diagram showing a configuration of an electrical connecting apparatus according to an embodiment.

FIG. 2 is a configuration diagram showing a configuration of an electrical connecting apparatus according to the embodiment. Although FIG. 2 shows main components of an electrical connecting apparatus 1, the electrical connecting apparatus 1 is not limited to these components, and in fact includes other components not shown in FIG. 2. Hereinafter, reference is made to “upper” and “lower” by focusing on the vertical direction in FIG. 2.

In FIG. 2, the electrical connecting apparatus 1 according to the embodiment includes: a flat plate-shaped support member 44; a flat plate-shaped wiring board 41 held on a lower surface of the support member 44; an electrical connection unit 42 electrically connected to the wiring board 41; and a probe substrate 43 electrically connected to the electrical connection unit 42. The probe substrate 43 is equipped with a plurality of electrical contactors (hereinafter also referred to as “probes”) 3, each electrical contactor being electrically connected to an electrode terminal 51 of the object 2 to be inspected.

The electrical connecting apparatus 1 uses a number of fixing members (for example, screw members, such as bolts) when assembling the support member 44, the wiring board 41, the electrical connection unit 42, the probe substrate 43, and the like, but the illustration of these fixing members is omitted in FIG. 2.

The electrical connecting apparatus 1 targets, for example, a semiconductor integrated circuit or the like formed on a semiconductor wafer, as an object 2 to be inspected, and performs electrical inspection on the object 2 to be inspected. Specifically, the object 2 to be inspected is pressed toward the probe substrate 43, so that the tips of the respective electrical contactors 3 on the probe substrate 43 and the electrode terminals 51 on the object 2 to be inspected come into electrical contact with each other. Then, during the inspection, an electrical signal from an inspection device (tester) (not shown) is supplied to each of the electrode terminals 51 of the object 2 to be inspected via each electrical contactor 3, and further, an electrical signal from the electrode terminal 51 of the object 2 to be inspected is supplied to the inspection device via each of the electrical contactors 3. In this way, the inspection device captures the electrical characteristics of the object 2 to be inspected, thereby performing the electrical inspection on the object 2 to be inspected.

The object 2 to be inspected, which is a target of inspection, is placed on an upper surface of a chuck top 5. The position of the chuck top 5 can be adjusted in the horizontal X-axis direction, in the Y-axis direction perpendicular to the X-axis direction on a horizontal plane, and in the Z-axis direction perpendicular to the horizontal plane (X-Y plane), and the rotational posture of the chuck top 5 can be adjusted in a θ-axis direction around the Z-axis. When performing electrical inspection on the object 2 to be inspected, the chuck that can be raised and lowered in the vertical direction (in the Z-axis direction) is moved, so that the electrode terminals 51 of the object 2 to be inspected come into electrical contact with the tips of the respective electrical contactors 3 on the probe substrate 43. Thus, the lower surface of the probe substrate 43 in the electrical connecting apparatus 1 and the object 2 to be inspected on the chuck top 5 are moved so as to be relatively close to each other.

[Support Member]

The support member 44 is to suppress the deformation (for example, bending or the like) of the wiring board 41. For example, since the probe substrate 43 is equipped with a number of electrical contactors 3, the weight of the probe substrate 43 installed onto the wiring board 41 side becomes great. When performing the electrical inspection on the object 2 to be inspected, the object 2 to be inspected on the chuck top 5 is pressed against the probe substrate 43, so that the tips of the probes 20 and the electrode terminals 51 on the object 2 to be inspected are in electrical contact with each other. In this way, during the electrical inspection, a reaction force (contact load) is applied to thrust upward from the bottom, whereby a large load is also applied onto the wiring board 41, which can cause the wiring board 41 to deform (for example, bend or the like). The support member 44 functions as a member that suppresses such deformation (for example, bending or the like) of the wiring board 14.

[Wiring Board]

The wiring board 41 is formed from a resin material, such as polyimide, for example, and is a printed circuit board or the like formed in a substantially circular-plate shape, for example. A number of electrode terminals (not shown) electrically connected to the test head (not shown) of the inspection device are disposed at a circumferential edge portion of an upper surface of the wiring board 41. Further, a wiring pattern (not shown) is formed on a lower surface of the wiring board 41, so that the connection terminals of the wiring pattern are electrically connected to upper ends of the plurality of connectors (not shown) provided in the electrical connection unit 42.

The wiring board 41 can have various configurations, and can have, for example, the following configuration. For example, the electrode terminals electrically connected to the test head are formed on the upper surface of the wiring board 41, while the wiring pattern electrically connected to each connector of the electrical connection unit 42 is formed on the lower surface of the wiring board 41. Further, a wiring circuit is formed inside the wiring board 41. The wiring pattern on the lower surface of the wiring board 41 and the electrode terminals on the upper surface of the wiring board 41 can be connected via the wiring circuit inside the wiring board 41. Therefore, the electrical signal can be conducted between each connector of the electrical connection unit 42 and the test head through the wiring circuit within the wiring board 41. It is noted that a plurality of electronic components required for the electrical inspection of the object 2 to be inspected are disposed on the upper surface of the wiring board 41.

[Electrical Connection Unit]

The electrical connection unit 42 has a plurality of connectors, such as pogo pins, for example. In the assembled state of the electrical connecting apparatus 1, the upper end of each connector is electrically connected to the connection terminal of the wiring pattern on the lower surface of the wiring board 41, while the lower end of each connector is connected to each pad provided on the upper surface of the probe substrate 43. Since the tip of the electrical contactor 3 is in electrical contact with the electrode terminal 51 of the object 2 to be inspected, the electrode terminal 51 of the object 2 to be inspected is electrically connected to the inspection device through the electrical contactors 3 and the connectors, thus enabling the electrical inspection using the inspection device.

[Probe Substrate]

The probe substrate 43 is a substrate having a plurality of electrical contactors 3, and is formed in a substantially circular or polygonal shape (for example, a hexadecagonal shape or the like). When the probe substrate 43 is attached to the electrical connecting apparatus 1, the probe substrate 43 has its circumferential edge portion supported by a probe substrate supporting portion 18.

The electrical contactor 3 incorporated in the probe substrate 43 may use, for example, a cantilever probe, but is not limited thereto. The electrical contactors 3, the number of which depends on the number of objects 2 to be inspected (semiconductor integrated circuits), the number of the electrode terminals 51 of each object 2 to be inspected, or the like, are incorporated in the probe substrate 43.

Figure 1:
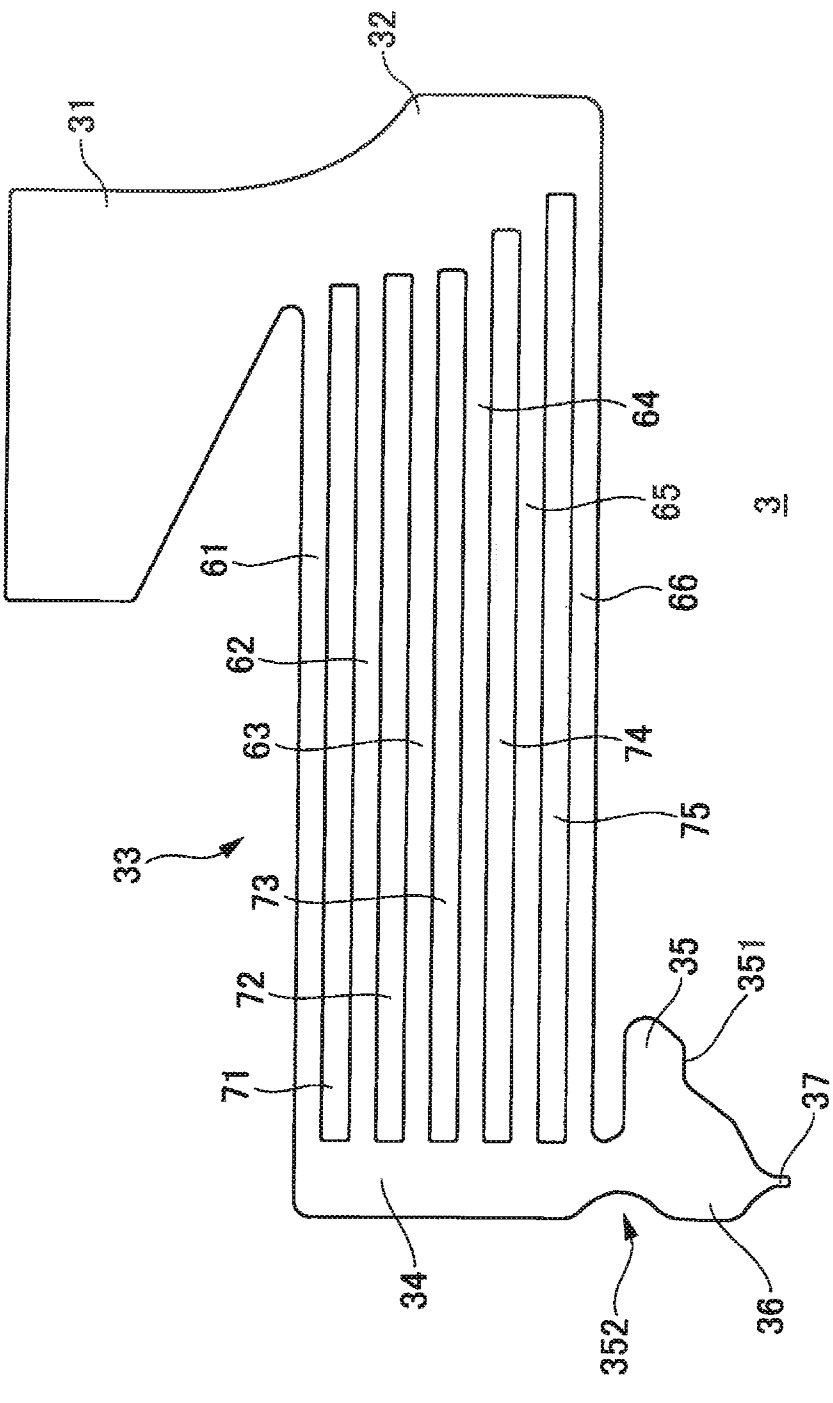
FIG. 1 is a configuration diagram showing a configuration of an electric contractor according to an embodiment.

The probe substrate 43 can have various configurations, FIG. 1 shows one example of this. For example, the probe substrate 43 has a substrate member 431 formed by a ceramic plate, for example, and a multilayer wiring board 432 formed on the lower surface of the substrate member 431.

A number of conductive paths (not shown) that penetrate in the direction of the plate thickness may be formed inside the substrate member 431, which is a ceramic substrate. Pads are formed on the upper surface of the substrate member 431, which is formed so that one end of each conductive path in the substrate member 431 is connected to the connection terminal of the corresponding wiring pattern on the upper surface of the substrate member 431. The lower surface of the substrate member 431 is formed so that the other end of each conductive path in the substrate member 431 is connected to the connection terminal provided on the upper surface of the multilayer wiring board 432.

The multilayer wiring board 432 is formed by a plurality of multilayer boards formed by synthetic resin members made of, for example, polyimide or the like, and wiring paths (not shown) may be formed between the plurality of multilayer boards. One end of each wiring path in the multilayer wiring board 432 is connected to the other end of the conductive path of the substrate member 431, while the other end of the multilayer wiring board 432 is connected to the probe land provided on the lower surface of the multilayer wiring board 432. A plurality of electrical contactors 3 are disposed in probe lands provided on the lower surface of the multilayer wiring board 162, and the plurality of electrical contactors 3 of the probe substrate 43 are electrically connected to the corresponding connection terminals of the wiring board 41 via the electrical connection unit 42.

(A-1-2) Electrical Contactor

FIG. 1 is a configuration diagram showing a configuration of the electrical contactor according to the embodiment. In FIG. 1, the electrical contactor 3 has an installing portion 31, a base end portion 32, an arm portion 33, a coupling portion 34, a positioning portion 35, a pedestal portion 36, and a contact portion 37.

The electrical contactor 3 is formed by a plate-shaped conductive member (for example, metal material) and conducts an electrical signal between the electrode terminal 51 of the object 2 to be inspected as a first contact target and a wiring terminal 433 (see FIG. 4 and the like) of the probe substrate 43 as a second contact target. For example, the electrical contactor 3 can be formed by plating or the like. The electrical contactors 3 are formed with the same thickness or the same level of thickness as the whole.

The dimensions of the electrical contactor 3 are not particularly limited because they are determined depending on the size of the electrode terminal 51 of the object 2 to be inspected, the interval between the electrode terminals 51, and the like. However, the dimensions (length) of the electrical contactor 3 in the left and right directions can be, for example, approximately several millimeters.

The electrical contactor 3 is a cantilever-type contactor in which the arm portion 33 coupled to the base end portion 32 side is elastically deformed by the application of the contact load from the electrode terminal 51 side toward the contact portion 37 side when the electrode terminal 51 of the object 2 to be inspected and the contact portion 37 are in electrical contact with each other, thus causing the arm portion 33 to elastically support the contact portion 37. Thus, the contact portion 37 and the electrode terminal 51 can surely come into electrical contact with each other while suppressing the contact load between the contact portion 37 and the electrode terminal 51.

[Installing Portion]

The installing portion 31 is a portion installed onto the lower surface of the probe substrate 43 and is in electrical contact with the wiring terminal 433 of the probe substrate 43. In FIG. 1, a case where the installing portion 31 has a rectangular shape is illustrated, but the shape of the installing portion may be changed according to the method of installing the electrical contactor 3 onto the probe substrate 43. Alternatively, necessary elements for installation onto the probe substrate 43 may be provided, for example, by providing one or a plurality of holes in the installing portion 31 or the like. The base end portion 32 is integrally formed with the lower portion of the installing portion 31.

[Ease End Portion]

The base end portion 32 is a portion extending downward from the lower portion of the installing portion 31. The base end portion 32 is a portion that is coupled to a rear end of the arm portion 33 (the right end of the arm portion 33 in FIG. 1) to thereby support the elastically deformable arm portion 33. It is noted that in FIG. 1, the base end portion 32 extends from the lower portion of the installing portion 31 diagonally rightward and downward. This is because the length of the elastic arm portion 33 in the left and right directions is shortened as the diameter of the electrode terminal 51 of the object 2 to be inspected becomes smaller or as the pitch between the electrode terminals 51 becomes narrower, or the like, which makes it difficult to bend the arm portion 33 and to control the amount of movement of the contact portion 37. Therefore, by slightly extending the base end portion 32 diagonally rightward and downward with respect to the installing portion 31, the length of the arm portion 33 in the left and right direction can be ensured to some extent, thereby enabling the elasticity of the arm portion 33 to effectively act to control the amount of movement of the contact portion 37.

[Arm Portion]

The arm portion 33 is a portion elastically supporting the contact portion 37. The arm portion 33 is a portion adjusting the amount of movement of the contact portion 37. FIG. 1 illustrates a case where the arm portion 33 is composed of six arm members.

In the following, each of the six arm members is referred to as, for example, a first arm portion 61 (or an arm portion 61) or the like, when describing them individually, and as an arm portion 33 when describing them collectively.

The rear ends (the right end in FIG. 1) of each of the first arm portion 61 to the sixth arm portion 66 are integrally coupled to the base end portion 32, while the tips (the left end in FIG. 1) of each of the first arm portion 61 to the sixth arm portion 66 are integrally coupled to the coupling portion 34 and extend linearly in the left and right directions (the longitudinal direction of the electrical contactor 3). When the contact portion 37 comes into electrical contact with the electrode terminal 51 of the object 2 to be inspected, each of the first arm portion 61 to the sixth arm portion 66 receives a load from the electrode terminal 51 toward the contact portion 37 to be elastically deformed, and thereby elastically supports the contact portion 37.

FIG. 1 illustrates a case where the first arm portion 61 to the sixth arm portion 66 have the same or substantially the same arm width. However, the arm widths of the first arm portion 61 to the sixth arm portion 66 may be different from each other.

Alternatively, the arm width of one arm member of each of the first arm portion 61 to the sixth arm portion 66 may vary depending on the position of a part of the arm member in the longitudinal direction. For example, the arm width of the rear end side (the base end portion 32 side) of the arm member may be relatively large, while the arm width of the tip side (the coupling portion 34 side) of the arm member may be relatively small. The reason for this is that when a load is applied to the tip side of the arm member, stress increases at the rear end side of each arm member. Therefore, by making the arm width larger at the rear end side of each arm member, the rear end side of each arm member can be reinforced.

The first arm portion 61 to the sixth arm portion 66 are provided to be spaced apart from each other in the vertical direction. In other words, in the arm portion 33, one arm member and another arm member adjacent thereto are arranged with a certain clearance kept therebetween. The size of each of clearances 71 to 75 may be a predetermined value, and in such a case, the first arm portion 61 to the sixth arm portion 66 are arranged at equal intervals.

It is noted that the clearances 71 to 75 in the arm portion 33 may also be regarded as slits from the viewpoint of the design and manufacturing process of the electrical contactor 3 and the like. From this viewpoint, in the electrical contactor 3, five slits 71 to 75 are formed in the left and right directions at predetermined intervals, in a member (i.e., a portion corresponding to the arm portion 33) between the contact portion 37 that comes into contact with the electrode terminal 51 as a first contact target and the installing portion 31 in contact with a wiring terminal 433 on the probe substrate 43 as a second contact target, whereby the six arm portions (the first arm portion 61 to the sixth arm portion 66) are formed.

It is noted that the sizes of all the clearances 71 to 75 (i.e., the lengths of the slits 71 to 75 in the vertical direction) are not limited to a predetermined value, and the sizes of the clearances 71 to 75 may be different from each other. For example, the sizes of the clearances 74 and 75 positioned on the lower side of the arm portion 33 may be set relatively large, while the sizes of the clearances 71, 72, and 73 positioned on the upper side of the arm portion 33 may be set relatively small. Thus, the needle pressure against the electrode terminal 51 and the amount of movement of the contact portion 37 can be adjusted.

Further, the lengths of the clearances 71 to 75 in the left and right directions also affect the lengths of each the first arm portion 61 to the sixth arm portion 66 in the left and right directions, and also affect the elasticity (bending) of the arm portions. For example, the lengths of the clearances 74 and 75 in the left and right directions located on the lower side of the arm portion 33 may be made relatively large, while the sizes of the clearances 71, 72, and 73 positioned on the upper side thereof may be made relatively small. Consequently, for example, the lengths of the fifth arm portion 65 and the sixth arm portion 66 in the left and right directions are longer than that of the other arm portions, and thereby their degrees of bending become greater, which can adjust the needle pressure and the amount of movement of the contact portion 37.

[Coupling Portion]

The coupling portion 34 is a portion integrally coupled to each of the tins of the first arm portion 61 to the sixth arm portion 66. The coupling portion is a member extending in the vertical direction and is formed substantially in a rectangular shape.

[Positioning Portion]

The positioning portion 35 is a portion integrally coupled to the lower portion of the coupling portion 34 and extending from the lower portion toward the base end portion 32 side (in the right direction). A lower surface portion 351 of the positioning portion 35 is formed linearly in the left and right directions. The positioning portion 35 is a portion for positioning the contact portion 37 with respect to the electrode terminal 51 of the object 2 to be inspected. In particular, the lower surface portion 351 of the positioning portion 35 is formed linearly in the left and right directions, thereby surely enabling the positioning of the contact portion 37.

In addition, a position confirmation portion 352 formed in an arc shape is provided in a position opposed to the positioning portion 35. The most recessed portion of the arc-shape of the position confirmation portion 352 is located at a position that corresponds to the position of the contact portion 37 provided at the lower end of the pedestal portion 36. Thus, the contact portion 37 can be caused to come into electric contact with the electrode terminal 51 of the object 2 to be inspected, while confirming the position of the contact portion 37.

[Pedestal Portion, Contact Portion]

The pedestal portion 36 is a portion extending downward from the lower portion of the positioning portion 35. The contact portion 37 is a portion provided in the lower portion of the pedestal portion and comes into electrical contact with the electrode terminal 51 of the object 2 to be inspected.

[Explanation of Attached State of Electrical Contactor 3]

Next, a description will be given on a state in which the electrical contactor 3 is attached to the wiring terminal 433 of the probe substrate 43, and a state in which the contact portion 37 comes into contact with the electrode terminal 51, with reference to the drawings.

Figure 3:
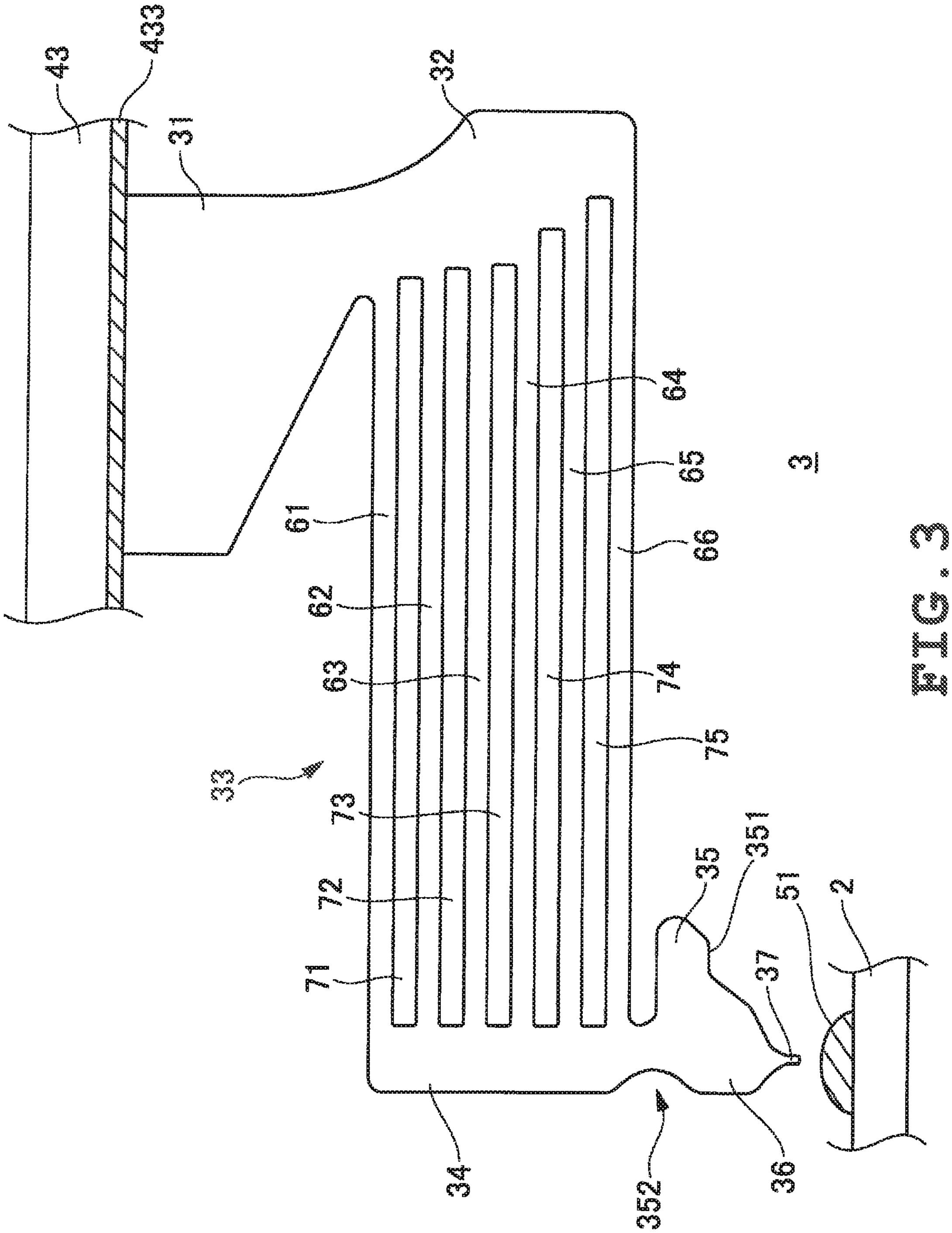
FIG. 3 is a configuration diagram showing a state in which the electrical contactor of the embodiment is attached.
Figure 4:
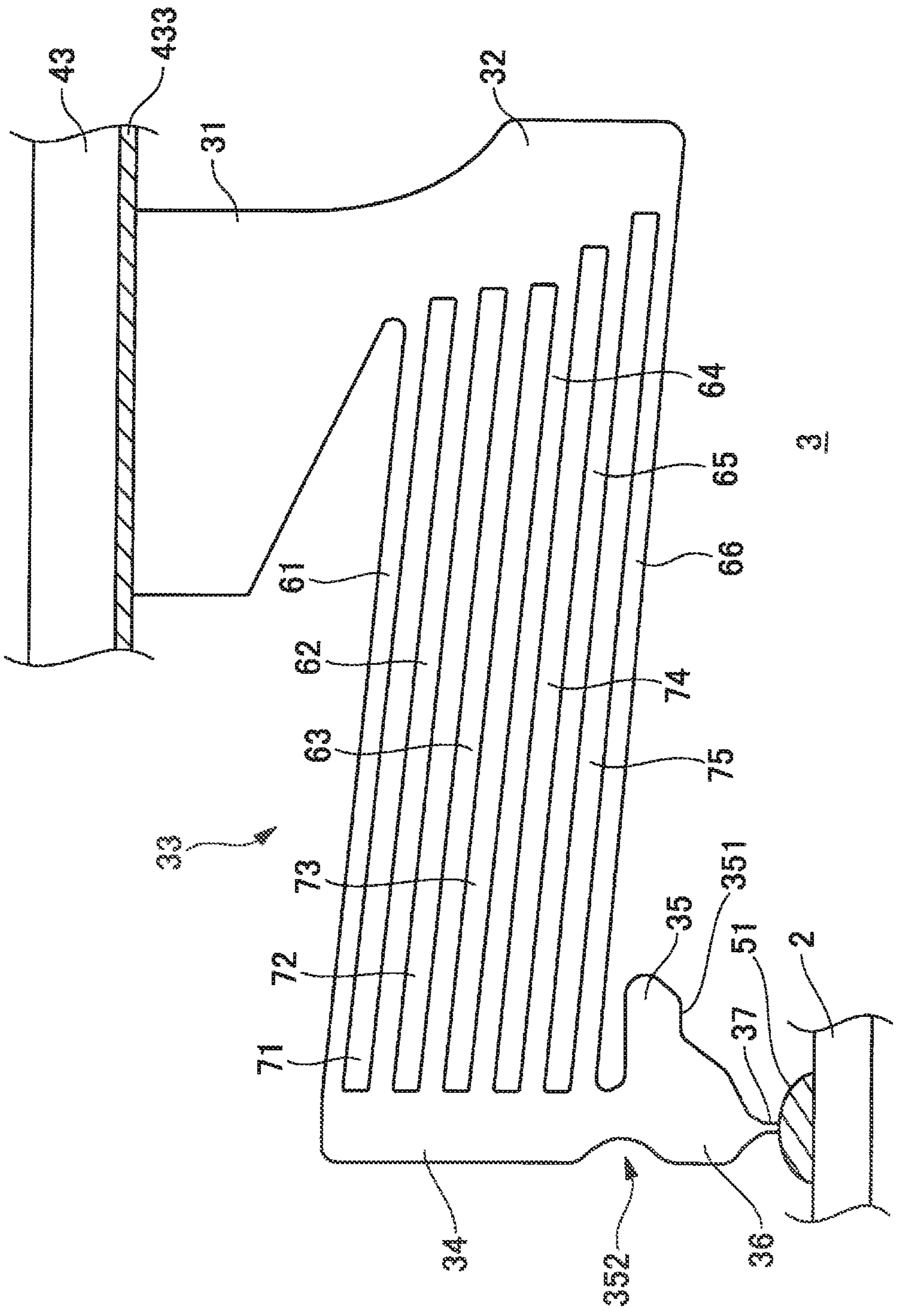
FIG. 4 is a diagram showing a state in which a contact portion of the electrical contactor of the embodiment and an electrode terminal of an object to be inspected are in electrical contact with each other.

FIG. 3 is a configuration diagram showing the state in which the electrical contactor 3 of the embodiment is attached. FIG. 4 is a diagram showing the state in which the contact portion 37 of the electrical contractor 3 of the embodiment and the electrode terminal 51 of the object 2 to be inspected are in electrical contact with each other.

As shown in FIG. 3, the installing portion 31 of the electrical contactor 3 is installed on the wiring terminal 433 of the probe substrate 43, and the electrical contactor 3 is installed on the probe substrate 43.

As shown in FIG. 4, when the contact portion 37 of the electrical contactor 3 and the electrical terminal 51 of the object 2 to be inspected come into electrical contact with each other, a contact load is applied, causing a load (a reaction force) from the electrode terminal 51 toward the contact portion 37 to be applied to the tip side of each of the first arm portion 61 to the sixth arm portion 66. The first arm portion 61 to the sixth arm portion 661 supported by the base end portion 32 are elastically deformed, so that the first arm portion 61 to the sixth arm portion 66 elastically support the contact portion 37.

A conventional cantilever electrical contactor having arm portions is designed to set the needle pressure against the electrode terminal 51 of the object 2 to be inspected to a target value or to decrease the amount of movement of the contact portion supported by the arm portion when the contact portion is in contact with the electrode terminal 51. Specifically, in an example of a conventional electrical contactor with two arm portions, the needle pressure, the amount of movement of the contact portion, and the like are adjusted by finely adjusting the arm widths (the lengths in the vertical direction) of the two arm members.

However, because the number of arm portions is small, the adjustable arm width is limited even though the arm width or the like of the arm portion is intended to be adjusted in order to reduce the resistance value, and thus the adjustment of the arm portion is not easy.

In contrast, in the electrical contactor 3 of this embodiment, the number of arm members in the arm portion 33 is set greater than that in the conventional arm portion. Therefore, as illustrated in FIG. 4, when the contact portion 37 and the electrode terminal 51 come into contact with each other, the load is applied to the first arm portion 61 to the sixth arm portion 66, so that the stress in the arm portion 33 is distributed to the first arm portion 61 to the sixth arm portion 66.

As a result, the stress applied to one arm member become less, whereby the durability of the arm portion 33 (the first arm portion 61 to the sixth arm portion 66) is better than that of the arm portion in a conventional electrical contactor.

Further, since the stress in the arm portion 33 is distributed to make the stress of one arm member (one of the first arm portion 61 to the sixth arm portion 66) less, the arm width of one arm member can be smaller than the arm width of the arm portion in the conventional electrical contactor.

Furthermore, since the arm width of one arm member (one of the first arm portion 61 to the sixth arm portion 66) can be smaller than that of the conventional arm member, the cross-sectional area per arm member becomes smaller than the cross-sectional area per conventional arm member when the thickness of the electrical contactor 3 is the same as the thickness of the conventional electrical contactor.

However, the arm portion 33 of the electrical contactor 3 has more arm members (the first arm portion 61 to the sixth arm portion 66) than the conventional arm portion. Thus, the entire cross-sectional area of the arm portion 33, i.e., the total cross-sectional area of the cross-sectional areas of the first arm portion 61 to the sixth arm portion 66, is larger than the entire cross-sectional area of the arm portion of the conventional electrical contactor. In other words, since the entire cross-sectional area of the arm portion 33 increases, the resistance value of the arm portion 33 can be made smaller than, the resistance value of the arm portion in the conventional electrical contactor when the arm portion 33 has the same arm length (the length in the left and right directions) as the arm portion in the conventional electrical contactor. That is, the resistance value of the arm portion 33 can be reduced.

In this way, the resistance value of the arm portion 33 of the electrical contactor 3 can be made smaller than the resistance value of the arm portion in the conventional electrical contactor. When an electrical signal flows through the electrical contactor 3, the conductivity of the electrical signal is made better than that of the conventional contactor, and consequently the inspection accuracy can be improved.

When an electrical signal flows through the electrical contactor 3, the electrical signal flows through one of the first arm portion 61 to the sixth arm portion 66. That is, in the electrical contactor 3, the electrical signal passes through any one path of the first arm portion 61 to the sixth arm portion 66 between the electrode terminal (the first contact target) of the object 2 to be inspected and the wiring terminal 433 (the second contact target) of the probe substrate 43. In this way, the conductive path of the electrical signal in the electrical contactor 3 can be distributed, thereby preventing the plastic deformation of the first arm portion 61 to the sixth arm portion 66 due to joule heat.

(A-2) Modified Embodiment

This embodiment exemplifies a case where the arm portion 33 of the electrical contactor 3 has six arm members (the first arm portion 61 to the sixth arm portion 66). As the number of arm members of the arm portion 33 increases, the cross-sectional area of the entire arm portion 33 can be increased, thus reducing the resistance value in the arm portion 33. Therefore, when designing the arm portion 33 of the electrical contactor 3 from the viewpoint of reducing the resistance value of the arm portion 33 of the electrical, contactor 3, the number of arm members of the arm portion 33 is not limited to six, but can be at least three or more, and is desirably one between four and eight. Further, when designing the electrical contactor 3, the length of the arm portion 33 in the vertical direction is limited, but if possible, the number of arm members may be ten or more than ten.

(A-2-1) Modified Embodiment (Part 1)

Figure 5:
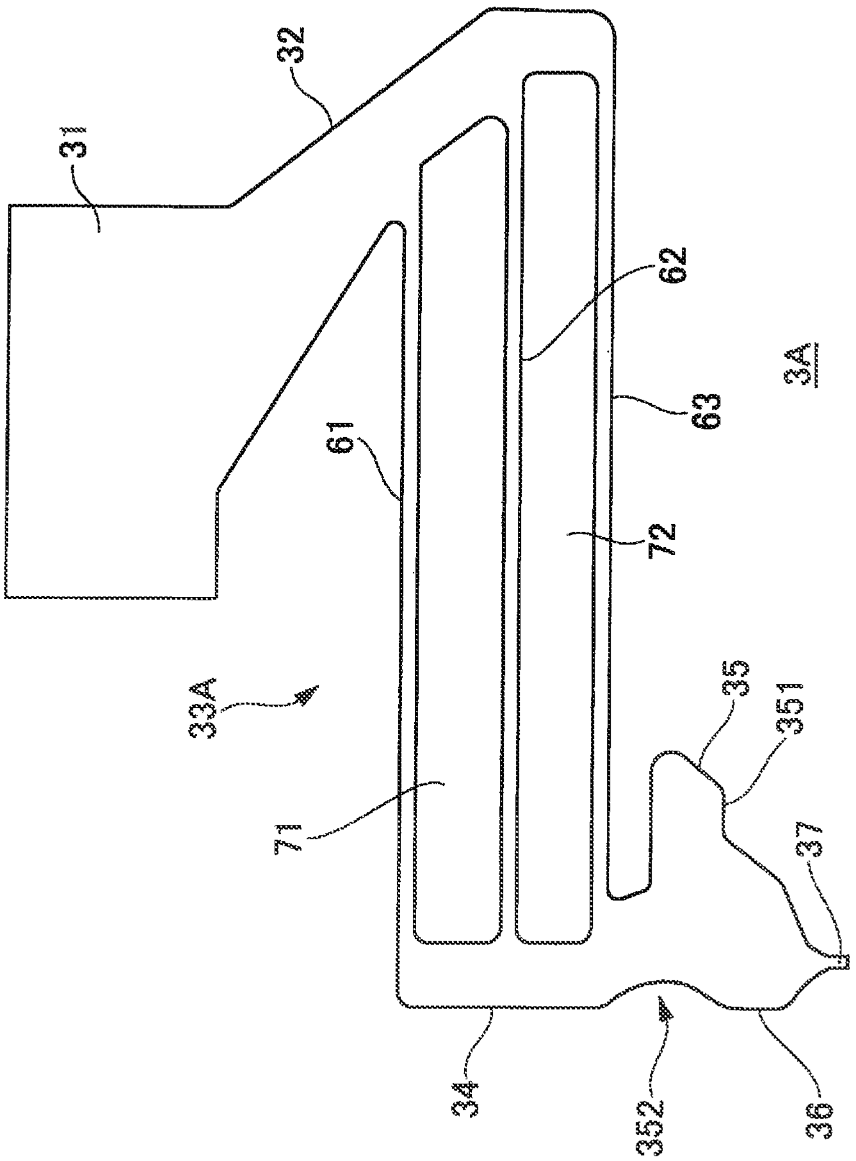
FIG. 5 is a configuration showing a configuration diagram of an electrical contactor according to a modified embodiment (Part 1)

FIG. 5 is a configuration diagram showing a configuration of an electrical contactor according to a modified embodiment.

FIG. 5 illustrates a case where the arm portion 33A of the electrical contactor 3A has three arm members (a first arm portion 61, a second arm portion 62, and a third arm portion 63). The other components are the same as the components of the electrical contactor 3 shown in FIG. 1, and thus in FIG. 5, the same components are denoted by the same number.

In FIG. 5, the arm portion 33A of the electrical contactor 3A has the first arm portion 61 to the third arm portion 63 as three arm members, and thus the total cross-sectional area of the first arm portion 61 to the third, arm portion 63 is larger than the cross-sectional area of the arm portion of the conventional electrical contactor with two arm members. Therefore, also in this case, the reduction in the resistance value of the arm portion 33A can be achieved, and when the electrical signal flows through the electrical contactor 3A, the conductivity of the electrical signal is made much better than in the conventional case, and consequently, the inspection accuracy can be improved.

When an electrical signal flows through the electrical contactor 3A, the electrical signal passes through any one path of the first arm portion 61 to the third arm portion 63 between the electrode terminal (the first contact target) of the object 2 to be inspected and the wiring terminal 433 (the second contact target) of the probe substrate 43, thereby making it possible to prevent the plastic deformation of the first arm portion 61 to the third arm portion 63 due to joule heat.

Further, since in the electrical contactor 3A, the number of arm members of the arm portion 33A is increased, when the contact portion 37 and the electrode terminal 51 come into contact with each other, the stress in the arm portion 33A is distributed over the first arm portion 61 to the third arm portion 63. Thus, the stress applied to one arm member become less, and thereby the durability of the arm portion 33A (the first arm portion 61 to third arm portion 63) is better than that of the arm portion in the conventional electrical contactor.

(A-2-2) Modified Embodiment (Part 2)

Figure 6:
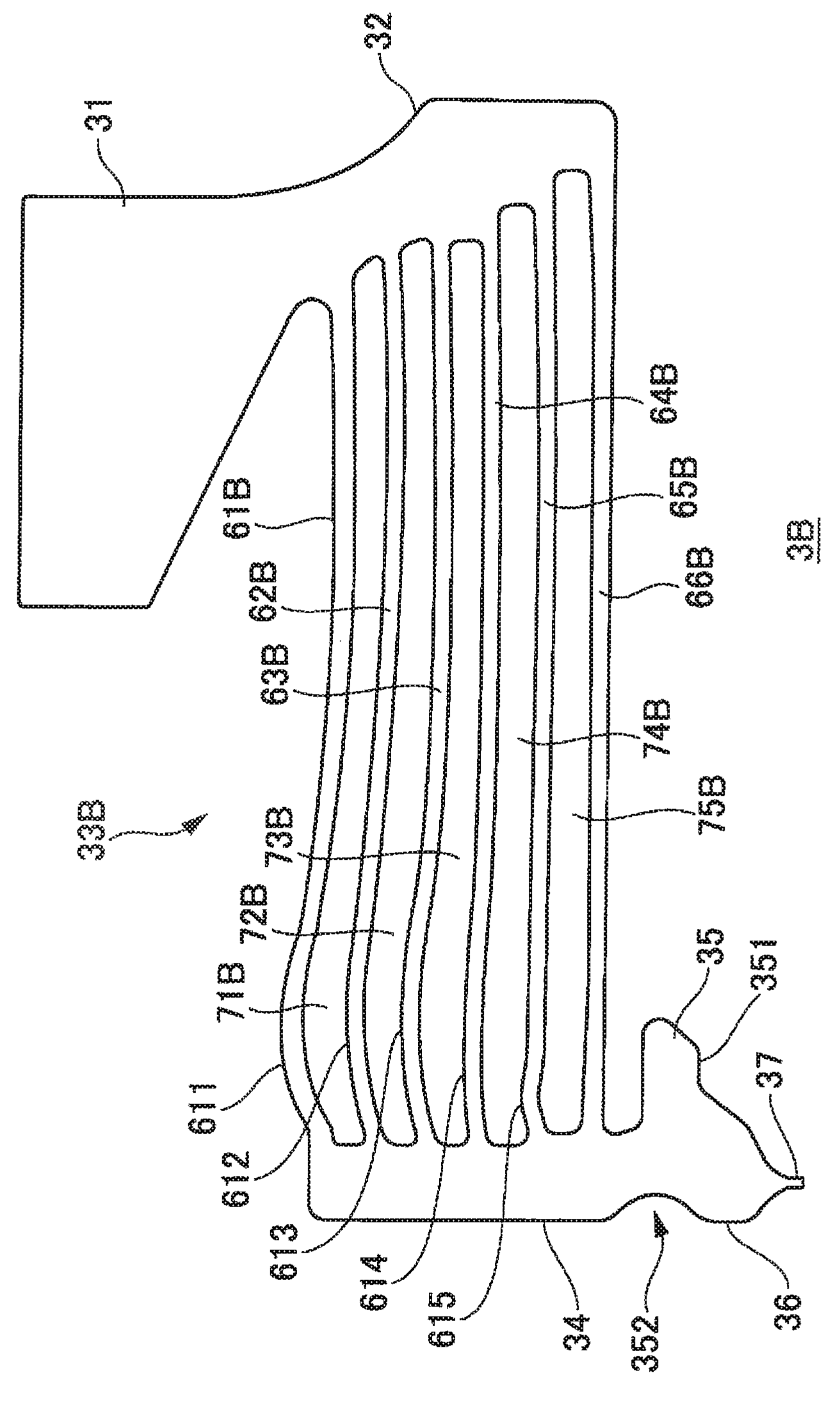
FIG. 6 is a configuration showing a configuration diagram of an electrical contactor according to a modified embodiment (Part 2).

FIG. 6 is a configuration diagram showing a configuration of an electrical contactor according to a modified embodiment.

FIG. 6 illustrates a case where the arm portion 33B of the electrical contactor 3B has six arm members (a first arm portion 61A to a sixth arm portion 66B). The other components are the same as the components of the electrical contactor 3 shown in FIG. 1, and thus in FIG. 6, the same components are denoted by the same number.

The arm portion 33B illustrated in FIG. 6 differs from the arm portion 33 of the electrical contactor 3 in FIG. 1 in that the tip sides (the coupling portion 34 sides) of the first arm portion 61B to the sixth arm portion 66B among the six arm members are provided with upwardly convex, curved portions 611 to 615 in order to adjust the needle pressure, the amount of movement of the contact portion 37 and the like.

In FIG. 6, of the six arm members, the sixth arm portion 66B, which is the closest to the contact portion 37, is not provided with any curved portion. This is because by making the sixth are portion 66B straight, the positioning of the contact portion 37 to be in contact with the electrode terminal 51 of the object 2 to be inspected is ensured. However, the electrical contactor is not limited to this case, and a curved portion may be provided in the sixth arm portion 66B in order to adjust the needle pressure, the amount of movement of the contact portion 37, and the like.

In the example of FIG. 6, the arc (the radius of the arc) of the curved portion 611 of the first arm portion 61B, which is the farthest from the contact portion 37 among the curved portions 611 to 615 of the first arm portion 61B to the fifth arm portion 65B, is set largest. As the curved portion approaches the contact portion 37, the arc (the radius of the arc) of each of the curved portions 612 to 615 is gradually smaller. This is due to the consideration of reducing the target needle pressure, the amount of movement of the contact portion 37, and the like. Further, the positions of the curved portions 611 to 615 provided in the first arm portion 61B to the fifth arm portion 65B are set at the corresponding positions, which can facilitate the design of the arm portion 33B.

The size of the arc (the radius of the arc), the curved shape, the position, and the like of the curved portion 611 to the curved portion 615 provided in the first arm portion 61B to the fifth arm portion 65B are not limited to those in FIG. 6. For example, the curved portion 611 to the curved portion 615 may be set in consideration of the arm widths of the first arm portion 61B to the sixth arm portion 66B, the target needle pressure, the amount of movement of the contact portion 37, and the like. Furthermore, for example, the curved portions 611 to 615 may be provided on the rear end side (the base end portion side) of the first arm portion 61B to the fifth arm portion 65B.

(A-3) Effects of Embodiments

As mentioned above, according to this embodiment, the number of arm members of the arm portion in the electrical contactor increases, and the cross-sectional area of the entire arm portion is increased, thereby making it possible to reduce the resistance value of the arm portion. Consequently, when the electric signal flows through the electrical contactor, the conductive characteristics of the electrical signal are made better, and thus the inspection accuracy of the object to be inspected can be improved.

According to this embodiment, by increasing the number of the arm members of the arm portion, the stress applied when the contact portion and the electrode terminal of the object to be inspected come into contact with each other is distributed, and thus the durability of the arm portion can be improved.

(B) Other Embodiments

Although various modified embodiments have been described in the above-mentioned embodiments, the present disclosure can also be applied to the following modified embodiments.

FIG. 6 illustrates a case where the arm portion 33B has six arm members (the first arm portion 61B to the sixth arm portion 66B), of which five arm members (the first arm portion 61B to the fifth arm portion 65B) are provided with curved portions 611 to 615. However, the number of arm members of the arm portion is not limited to six. That is, even when the number or arm members is any number other than six, the curved portion may be provided.

In FIG. 6, it is not limited to providing curved portions in all five arm members (the first arm portion 61B to the fifth arm portion 65B). In other words, part, i.e., one or some of the five arm members (the first arm portion 61B to the fifth arm portion 65B) may be provided with a curved portion (s) in consideration of the target needle pressure, the amount of movement of the contact portion, and the like.

REFERENCE SIGNS LIST

3, 3A and 3B . . . electrical contactor, 31 . . . installing portion, 32 . . . base end portion, 33, 33A, and 33B . . . arm portion, 34 . . . coupling portion, 35 . . . positioning portion, 351 . . . lower surface portion, 352 . . . position confirmation portion, 36 . . . pedestal portion, 37 . . . contact portion, 61 and 61B . . . first arm portion, 62 and 62B . . . second arm portion, 63 and 63B . . . third arm portion, 64 and 64B . . . fourth arm portion, 65 and 65B . . . fifth arm portion, 66 and 66B . . . sixth arm portion, 71 to 75 and 71B to 75B . . . clearance

1 . . . electrical connecting apparatus, 41 . . . wiring board, 42 . . . electrical connection unit, 43 . . . probe substrate, 431 substrate member, 432 . . . multilayer wiring board, 44 . . . support member, 2 . . . object to be inspected, 51 . . . electrode terminal

The invention claimed is:

1. An electrical contactor comprising:

a pedestal portion having, at a lower end thereof, a contact portion that comes into contact with a first contact target of an object to be inspected;

a base end portion extending continuously toward an installing portion that comes into contact with a second contact target of a substrate electrically connected to an inspection device side; and an arm portion having at least three arm members provided between the base end portion and the pedestal portion, each of the at least three members having one end supported by the base end portion and another end coupled to the pedestal portion to elastically support the contact portion, wherein an amount of movement and pressure applied by the arm portion is adjusted by adjusting dimensions of individual ones of the at least three arm members, and wherein a total electrical resistance value of the arm portion is adjusted by adjusting a total cross-sectional area of all of the at least three arm members, such that the amount of movement and pressure may be more finely adjusted by adjusting the dimensions of the individual ones of the at least three arm members while maintaining or increasing an electrical resistance of the arm portion as a whole, in comparison with an arm portion have only one or two arm members.

2. The electrical contactor according to claim 1, wherein part or all of the at least three or more arm portions each have a curved portion for decreasing an amount of movement of the contact portion with respect to the first contact target.

3. An electrical connecting apparatus comprising a plurality of electrical contactors that come into electrical contact with a first contact target and a second contact target, the electrical connecting apparatus electrically connecting the first contact target and the second contact target via each of the electrical contactors, wherein each of the plurality of electrical contactors is the electrical contactor according to claim 1.

4. The electrical contactor according to claim 1, wherein part or all of the at least three or more arm portions each have a curved portion for decreasing an amount of movement of the contact portion with respect to the first contact target.

5. An electrical connecting apparatus comprising a plurality of electrical contactors that come into electrical contact with a first contact target and a second contact target, the electrical connecting apparatus electrically connecting the first contact target and the second contact target via each of the electrical contactors, wherein each of the plurality of electrical contactors is the electrical contactor according to claim 2.

6. An electrical connecting apparatus comprising a plurality of electrical contactors that come into electrical contact with a first contact target and a second contact target, the electrical connecting apparatus electrically connecting the first contact target and the second contact target via each of the electrical contactors, wherein each of the plurality of electrical contactors is the electrical contactor according to claim 4.

* * * * *